US006987313B2

(12) United States Patent
Asada

(10) Patent No.: US 6,987,313 B2
(45) Date of Patent: Jan. 17, 2006

(54) SEMICONDUCTOR DEVICE

(75) Inventor: Junichi Asada, Yokkaichi (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/740,902

(22) Filed: Dec. 21, 2000

(65) Prior Publication Data

US 2002/0163068 A1 Nov. 7, 2002

(30) Foreign Application Priority Data

Dec. 24, 1999 (JP) ................................ 11-366673

(51) Int. Cl.
*H01L 23/48* (2006.01)

(52) U.S. Cl. ...................... 257/692; 257/690; 257/691; 257/692; 257/696; 257/698

(58) Field of Classification Search ........ 257/690–698, 257/666, E21.506–E21.519
See application file for complete search history.

(56) References Cited

U.S. PATENT DOCUMENTS 3,771,217 A * 11/1973 Hartman ........................ 438/6
4,466,183 A * 8/1984 Burns .......................... 29/827
4,770,640 A * 9/1988 Walter ......................... 439/69
5,036,381 A * 7/1991 Lin ............................ 257/693
5,198,888 A * 3/1993 Sugano et al. .............. 257/686
5,233,220 A * 8/1993 Lamson et al. ............. 257/666
5,648,299 A * 7/1997 Anjoh et al. ................ 438/123
5,825,081 A * 10/1998 Hosomi et al. ............. 257/668
5,861,662 A * 1/1999 Candelore ................... 257/679
6,060,770 A * 5/2000 Nakamura et al. .......... 257/668
6,084,291 A * 7/2000 Fujimori ..................... 257/668
6,104,083 A * 8/2000 Ito ............................ 257/666

FOREIGN PATENT DOCUMENTS

JP 63107126 A * 5/1988
JP 08064748 A * 3/1996
JP 10050924 A * 2/1998
JP 2000-208698 7/2000

* cited by examiner

*Primary Examiner*—Tom Thomas
*Assistant Examiner*—Chris C. Chu
(74) *Attorney, Agent, or Firm*—Oblon, Spivak, McClelland, Maier & Neustadt, P.C.

(57) ABSTRACT

Disclosed is a semiconductor device constructed such that a lead wire extending from an interposer is connected to a pad of a chip, wherein the chip is bonded to a resin molding with a high mechanical strength. In the semiconductor device of the present invention, the lead wires extending from the interposer formed of a polyimide film are connected to the pad of the chip, and the lead wires are arranged sparse. Dummy lead wires irrelevant to the electrical connection are also arranged in addition to the lead wires extending from the interposer so as to increase the total number of lead wires supporting the chip so as to permit the chip 11 to be bonded to the resin molding 15 with a high mechanical strength. The dummy lead wires mounted to the interposer together with the lead wires serve to improve the bonding strength between the resin molding and the chip.

4 Claims, 5 Drawing Sheets

SEMICONDUCTOR DEVICE

CROSS-REFERENCE TO RELATED APPLICATIONS

This application is based upon and claims the benefit of priority from the prior Japanese Patent Application No. 11-366673, filed Dec. 24, 1999, the entire contents of which are incorporated herein by reference.

BACKGROUND OF THE INVENTION

The present invention relates to a semiconductor device in which an interposer formed of a tape conforming with the thinning of a semiconductor substrate or an insulating film including an insulating substrate is used as a holder of a lead.

In a semiconductor device, thinning of a semiconductor element is being promoted in an attempt to achieve a high density assembly. Also, a plurality of thin semiconductor elements are stacked one upon the other in many cases for the actual use. The thin packages known to the art include, for example, a TSOP (Thin Small Outline Package), a TCP (Tape Carrier Package) and a BAG (Ball Grid Array).

FIGS. 1A and 1B are a plan view and a cross sectional view along the line IB—IB, respectively, collectively showing a semiconductor device of a conventional structure. A silicon chip having a thickness of 250 $\mu$m to 625 $\mu$m is used as a semiconductor element (chip) 1. A polyimide film 2 having a thickness of 75 $\mu$m is used as an interposer for supporting the chip 1 and holding a lead wire 3. The polyimide film 2 has an opening portion 6. One end portion of the lead wire 3, which is formed of, for example, a copper thin film, protrudes into the opening portion 6 so as to be connected directly to a connecting electrode (pad) 4 formed on the surface of the chip 1, with the other end portion projecting outward from the polyimide film 2.

That portion of the lead wire 3 which projects outward from the polyimide 2 constitutes an outer lead that is connected as an external connecting electrode to an external circuit. The other portion of the lead wire 3 constitutes an inner lead. For connecting the lead wire to the semiconductor element, known is a method of using a TAB tape, in which bumps are formed on the pads and a large number of lead wires are subjected to a bump bonding at a time. Also, a liquid resin such as an epoxy resin is dripped within the opening portion 6, which includes the connecting portion between the pad 4 and the lead wire 3, of the polyimide film 2 formed on the chip 1 and so as to form a resin molding 5.

In a package using an interposer, the connection between the interposer and the chip is achieved by a lead wire performing an electrical connection. The interposer and the chip arranged apart from the interposer are supported by the lead wire, and the reliability of the package such as the mechanical strength and the moisture resistance is improved by the resin molding applied later. As described above, the resin molding is performed in the prior art after the chip and the lead wire are connected to each other. However, where the distance between adjacent lead wires is large, the interposer tends to peel off the resin molding in the prior art. The peeling tends to be increased so as to give rise to the crack occurrence in the resin molding.

The crack is likely to bring about a lead cut-off, giving rise to a problem in respect of the visual appearance and the reliability. Further, where the distance between the adjacent lead wires is large, the lead wire is twisted during the period between the connection of the lead wire and the resin molding. Particularly, the lead wire distribution tends to become sparse where the number of pins is small relative to the chip size.

Further, where the thickness of the chip is small, i.e., about 50 $\mu$m, the chip is thinner than the polyimide film used as the interposer. If a resin molding is formed under such a condition by dripping a resin by means of potting, the resin is attached in an amount larger than required so as to form a thick semiconductor device, resulting in failure to achieve the object of decreasing the thickness of the semiconductor device. Under the circumstances, it is widely employed nowadays a method of attaching a back sheet to the polyimide film and the chip, followed by coating the connecting portion between the chip and the lead wire positioned on the back sheet with a resin by a printing technique so as to form a resin molding. Even in this case, it is impossible to overcome the difficulties leading to the lead cut-off such as the crack occurrence and twist of the lead.

BRIEF SUMMARY OF THE INVENTION

An object of the present invention, which has been achieved in an attempt to overcome the above-noted difficulties, is to provide a semiconductor device in which a lead wire extending from an interposer is connected to the pad of a chip, and the chip is bonded to the resin molding with a high mechanical strength.

Specifically, the present invention is directed to a semiconductor device constructed such that lead wires extending from an interposer are connected to pads of a chip and the lead wires are arranged sparse, and is featured in that dummy lead wires irrelevant to the electrical connection are added so as to increase the total number of lead wires extending from the interposer so as to permit the chip to be bonded to the resin molding with a high mechanical strength. It should be noted that the dummy lead wires mounted to the interposer together with the lead wires serve to improve the bonding strength between the resin molding and the chip.

According to an aspect of the present invention, there is provided a semiconductor device, comprising a semiconductor element; a plurality of lead wires connected to a plurality of connecting electrodes of the semiconductor element; at least one dummy lead wire that does not include an outer lead portion for electrically connecting the semiconductor element to an external circuit of the semiconductor element; an insulating film having an opening portion for accommodating the semiconductor element and serving to support the lead wires connected to the connecting electrodes of the semiconductor element and the dummy lead wire; and a resin molding covering the connecting portion between the tip portions of the lead wires and the connecting electrodes and the tip portion of the dummy lead wire within the opening portion of the insulating film.

It is possible to arrange the dummy lead wire covered with the resin molding such that the tip portion of the dummy lead wire is positioned between the peripheral portion of the opening portion and the peripheral portion of the semiconductor element arranged inside the opening portion. It is also possible for the tip portion of the dummy lead wire to extend over the semiconductor element. Further, it is possible to arrange the dummy lead wire in a large space having at least twice the minimum pitch of the lead wire arrangement.

It is also possible to arrange at least two dummy lead wires that are formed such that the tip portions of the two adjacent dummy lead wires are connected to each other. Further, it is possible to arrange the dummy lead wires in two sides of the semiconductor element positioned to face each other such that the tip portions of the dummy lead wires positioned to face each other are connected to each other. It is also possible for the semiconductor element to have a dummy connection electrode that is not electrically connected to the internal circuit and for the tip portion of the dummy lead wire to be connected to the dummy connection electrode. In this case, it is possible for the dummy connection electrode to be electrically connected to a power source line or a ground line.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Some embodiments of the present invention will now be described with reference to the accompanying drawings.

Figure 1A:
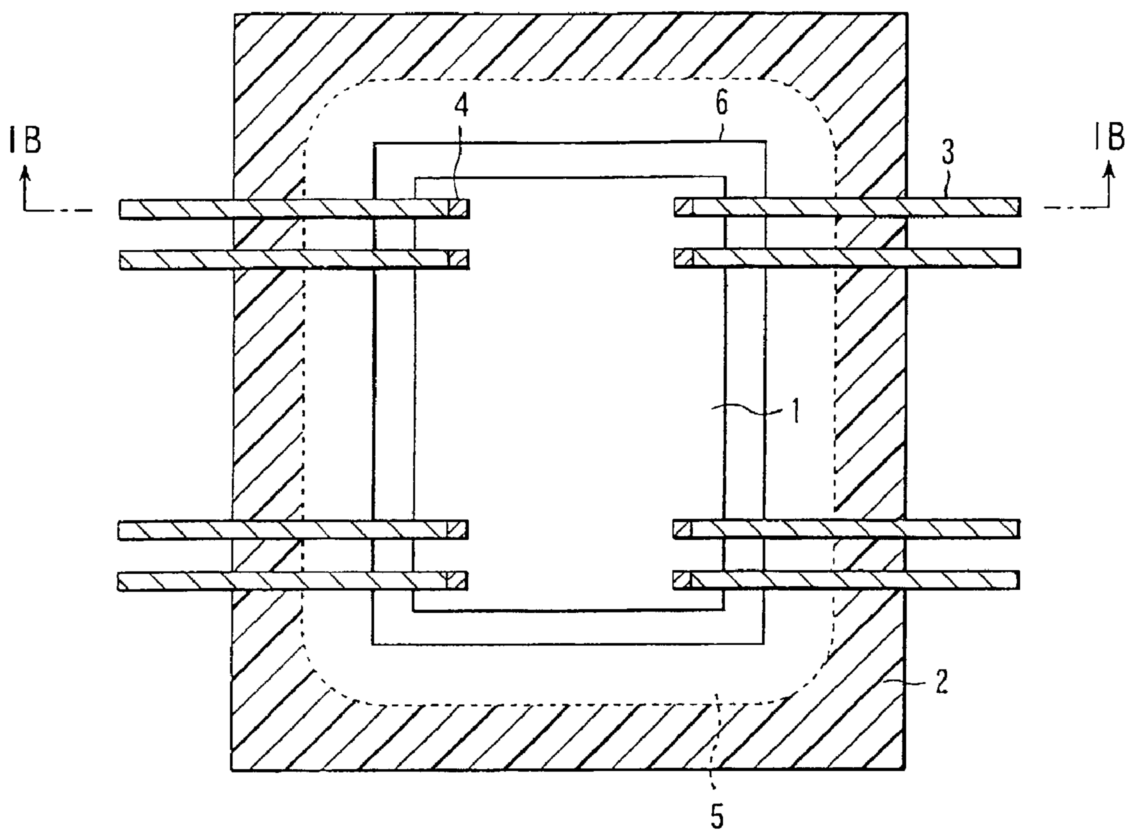
FIG. 1A is a plan view showing the construction of a conventional semiconductor device.
Figure 1B:
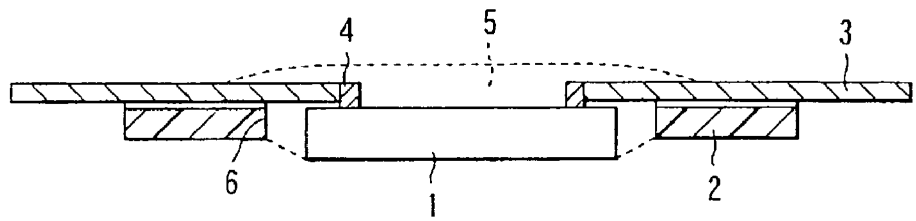
FIG. 1B is a cross sectional view along the line IB—IB shown in FIG. 1A.
Figure 2A:
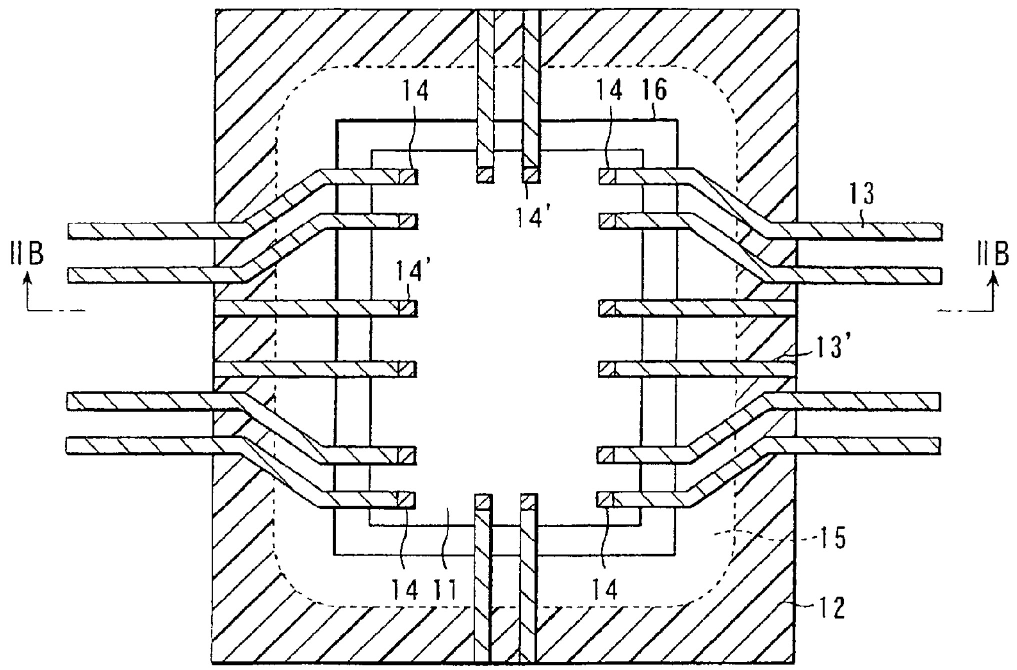
FIG. 2A is a plan view showing the construction of a semiconductor device according to a first embodiment of the present invention.
Figure 2B:
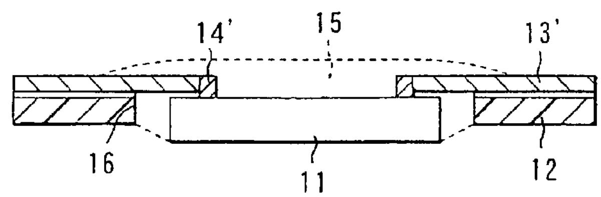
FIG. 2B is a cross sectional view along the line IIB—IIB shown in FIG. 2A.

Specifically, FIGS. 2A and 2B collectively show a semiconductor device according to a first embodiment of the present invention, wherein FIG. 2A is a plan view showing the construction of a semiconductor device according to the first embodiment of the present invention, and FIG. 2B is a cross sectional view along the line IIB—IIB shown in FIG. 2A. A silicon chip having a thickness of 150 μm to 625 μm is used as a semiconductor element (chip) 11. On the other hand, a polyimide film 12 having a thickness of 75 μm is used as the interposer for supporting the chip 11 and holding a lead wire 13. The polyimide film 12 has an opening portion 16 called a device hole.

One end portion of the lead wire 13, which is formed of, for example, a copper foil, extends into the opening portion 16 so as to be connected directly to a connection electrode (pad) 14 formed on the surface of the chip 11 by a single point ILB (Inner Lead Bonding) method, with the other end portion of the lead wire 13 extending outward from the polyimide film 12. That portion of the lead wire 13 which extends outward from the polyimide film 12 constitutes an outer lead acting as an external connection terminal that is electrically connected to an external circuit. The other portion of the lead wire 13 constitutes an inner lead. For connecting the lead wires to the semiconductor element, it is possible to employ a connection method in which bumps are formed on the pads and a TAB tape is used for connecting a large number of lead wires to the bumps at a time.

A plurality of pads 14 are formed on the chip 11. However, the pads 14 are not arranged dense, but are arranged sparse. In the first embodiment shown in FIGS. 2A and 2B, the lead wires 13 are arranged in, for example, the four corner portions of the chip 11. In other words, lead wires and pads are not arranged in the central portion of each side of the chip. Since the lead wire serving to improve the bonding strength between the chip 11 and a resin molding 15 is not arranged in the central portion in each side of the chip 11, cracks of the resin molding 15 tend to take place in the central portion in each side of the chip 11. Therefore, a dummy pad 14' is formed in the central portion in each side of the chip 11, and a dummy lead wire 13' supported by the polyimide film 12 is connected to the dummy pad 14'. Since the dummy lead wire 13' is not relevant to the electrical connection, an outer lead need not be arranged. It follows that the dummy lead wire 13' does not extend outward from the polyimide film 12.

Since the dummy lead wire 13' is arranged in the portion where the lead wire 13 is not arranged, the chip 11 is allowed to be bonded to the resin molding 15 with a high mechanical strength. As a result, it is possible for the dummy lead wire mounted to the interposer together with the lead wires to serve to improve the bonding strength between the resin molding and the chip. The resin molding 15 is formed by the method described below.

Specifically, a liquid resin such as an epoxy resin is dripped onto that portion of the chip 11 which includes the connecting portion between the lead wire 13 and the pad 14, the connecting portion between the dummy lead wire 13' and the dummy pad 14', and the contact portion among the polyimide film 12, the lead wire 13 and the dummy lead wire 13' so as to form the resin molding 15. It should be noted that the dummy lead wire 13' is arranged between adjacent lead wires 13 in the case where there is a large space between the adjacent lead wires 13. To be more specific, it is possible to arrange at least a single lead wire in a large space having at least twice the minimum pitch of the lead wire arrangement.

Figure 3A:
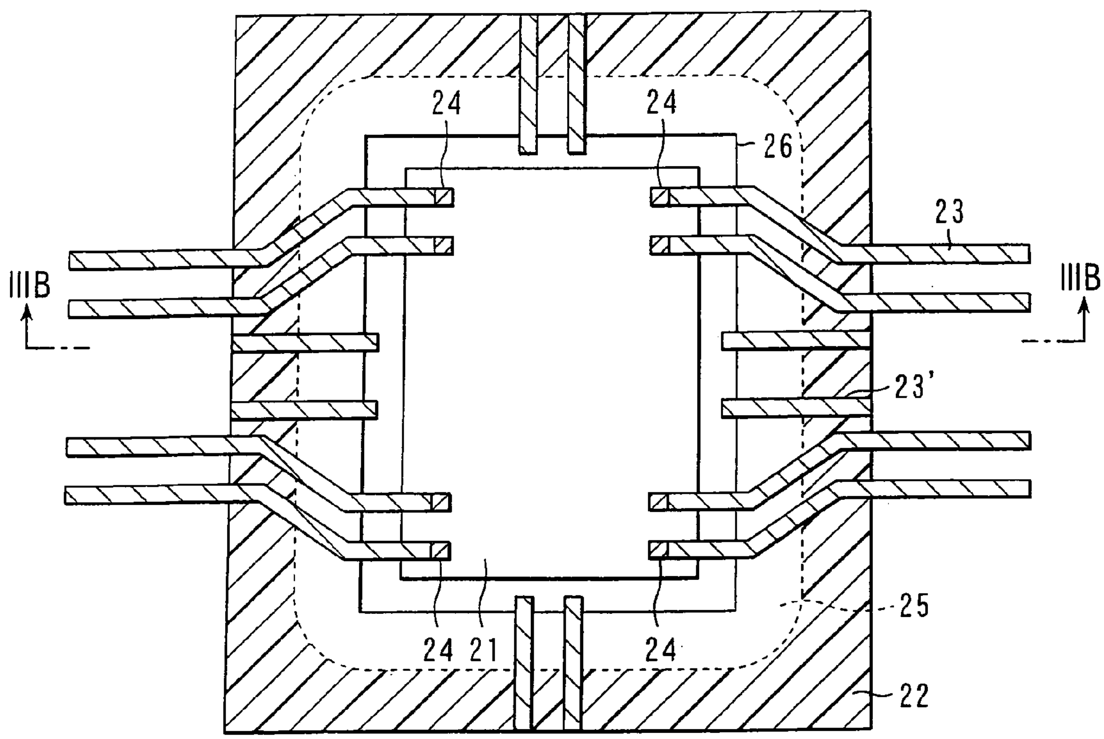
FIG. 3A is a plan view showing the construction of a semiconductor device according to a second embodiment of the present invention.
Figure 3B:
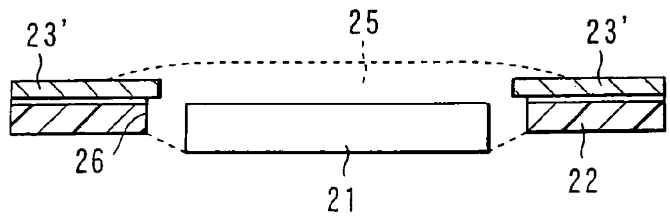
FIG. 3B is a cross sectional view along the line IIIB—IIIB shown in FIG. 3A.

A second embodiment of the present invention will now be described with reference to FIGS. 3A and 3B, wherein FIG. 3A is a plan view showing the construction of a semiconductor device according to the second embodiment of the present invention, and FIG. 3B is a cross sectional view along the line IIIB—IIIB shown in FIG. 3A. A silicon chip having a thickness of 150 μm to 625 μm is used as a semiconductor element (chip) 21. On the other hand, a polyimide film 22 having a thickness of 75 μm is used as the interposer for supporting the chip 21 and holding a lead wire 23. The polyimide film 22 has an opening portion 26 called a device hole.

One end portion of the lead wire 23, which is formed of, for example, a copper foil, extends into the opening portion 26 so as to be connected directly to a connection electrode (pad) 24 formed on the surface of the chip 21 by a single point ILB (Inner Lead Bonding) method, with the other end portion of the lead wire 23 extending outward from the polyimide film 22. That portion of the lead wire 23 which extends outward from the polyimide film 22 constitutes an outer lead acting as an external connection terminal that is electrically connected to an external circuit. For connecting the lead wires 23 to the semiconductor element, it is possible to employ a connection method in which bumps are formed on the pads and a TAB tape is used for connecting a large number of lead wires 23 to the bumps at a time.

A plurality of pads 24 are formed on the chip 21. However, the pads 24 are not arranged dense, but are arranged sparse. In the second embodiment shown in FIGS. 3A and 3B, the lead wires 23 are arranged in, for example, the four corner portions of the chip 21. In other words, lead wires and pads are not arranged in the central portion of each side of the chip. Since the lead wire 23 serving to improve the bonding strength between the chip 21 and a resin molding 25 is not arranged in the central portion in each side of the chip 21, cracks of the resin molding 25 tend to take place in the central portion in each side of the chip 21. Therefore, in the second embodiment, a dummy lead wire 23' is formed in the peripheral portion of the opening portion 26 facing the central portion in each side of the chip 21. The dummy lead wire 23' does not extend outward from the polyimide film 22. It should be noted that one end of the dummy lead wire 23' facing the chip 21 is positioned between the periphery of the opening portion 26 and the chip 21.

Since a dummy lead wire is arranged in the portion where a lead wire is not arranged, the chip 21 is allowed to be bonded to the resin molding 25 with a high mechanical strength. As a result, it is possible for the dummy lead wire 23' mounted to the interposer together with the lead wires 23 to serve to improve the bonding strength between the resin molding and the chip.

The resin molding 25 is formed as in the first embodiment. Specifically, a liquid resin such as an epoxy resin is dripped onto that portion of the chip 21 which includes the connecting portion between the lead wire 23 and the pad 24, and the contact portion between the polyimide film 22 and the dummy lead wire 23' so as to form the resin molding 25. It should be noted that at least a single dummy lead wire is arranged in a large space having at least twice the minimum pitch of the lead wire arrangement.

Figure 4A:
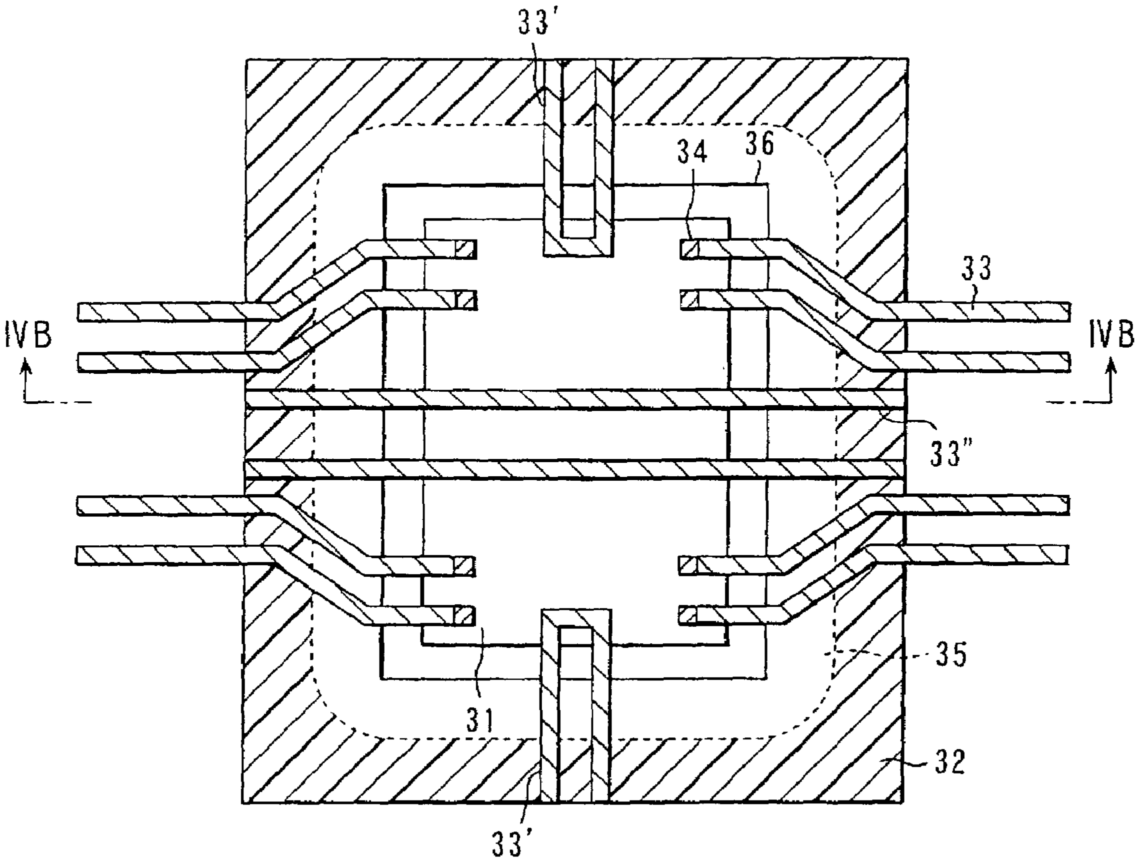
FIG. 4A is a plan view showing the construction of a semiconductor device according to a third embodiment of the present invention.
Figure 4B:
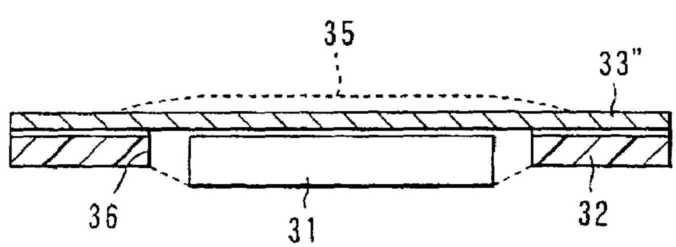
FIG. 4B is a cross sectional view along the line IVB—IVB shown in FIG. 4A.

A third embodiment of the present invention will now be described with reference to FIGS. 4A and 4B, wherein FIG. 4A is a plan view showing the construction of a semiconductor device according to the third embodiment of the present invention, and FIG. 4B is a cross sectional view along the line IVB—IVB shown in FIG. 4A. A silicon chip having a thickness of 150 μm to 625 μm is used as a semiconductor element (chip) 31. On the other hand, a polyimide film 32 having a thickness of 75 μm is used as the interposer for supporting the chip 31 and holding a lead wire 33. The polyimide film 32 has an opening portion 36 called a device hole.

One end portion of the lead wire 33, which is formed of, for example, a copper foil, extends into the opening portion 36 so as to be connected directly to a connection electrode (pad) 34 formed on the surface of the chip 31 by a single point ILB (Inner Lead Bonding) method, with the other end portion of the lead wire 33 extending outward from the polyimide film 32. That portion of the lead wire 33 which extends outward from the polyimide film 32 constitutes an outer lead acting as an external connection terminal that is electrically connected to an external circuit. For connecting the lead wires to the semiconductor element, it is possible to employ a connection method in which bumps are formed on the pads and a TAB tape is used for connecting a large number of lead wires to the bumps at a time.

A plurality of pads 34 are formed on the chip 31. However, the pads 34 are not arranged dense, but are arranged sparse. In the third embodiment shown in FIGS. 4A and 4B, the lead wires 33 are arranged in, for example, the four corner portions of the chip 31. In other words, lead wires and pads are not arranged in the central portion of each side of the chip. Since the lead wire 33 serving to improve the bonding strength between the chip 31 and a resin molding 35 is not arranged in the central portion in each side of the chip 31, cracks of the resin molding 35 tend to take place in the central portion in each side of the chip 31. Therefore, in the third embodiment, a dummy lead wire is formed in the peripheral portion of the opening portion 36 facing the central portion in each side of the chip 31. The dummy lead wire 33' does not extend outward from the polyimide film 32.

The semiconductor device according to the third embodiment of the present invention shown in FIGS. 4A and 4B comprises first and second dummy lead wires 33' and 33". The first dummy lead wire 33' consists of two adjacent dummy lead wires that are connected to each other in the tip portion. On the other hand, the second dummy lead wire 3" consists of lead wires formed in two sides, which face each other, of the chip 31. The tip portions of these lead wires facing each other are connected to each other. It should be noted that these first and second dummy lead wires 33' and 33" do not extend outward from the polyimide film 32.

Since a dummy lead wire is arranged in the portion where a lead wire is not arranged, the chip 31 is allowed to be bonded to the resin molding 35 with a high mechanical strength. As a result, it is possible for the dummy lead wires mounted to the interposer together with the lead wires to serve to improve the bonding strength between the resin molding 35 and the chip 31.

The resin molding 35 is formed as in the first embodiment. Specifically, a liquid resin such as an epoxy resin is dripped onto that portion of the chip 31 which includes the connecting portion between the lead wire 33 and the pad 34, and the contact portion between the polyimide film 32 and the dummy lead wires 33', 33" so as to form the resin molding 35. It should be noted that at least a single dummy lead wire is arranged in a large space having at least twice the minimum pitch of the lead wire arrangement.

Figure 5A:
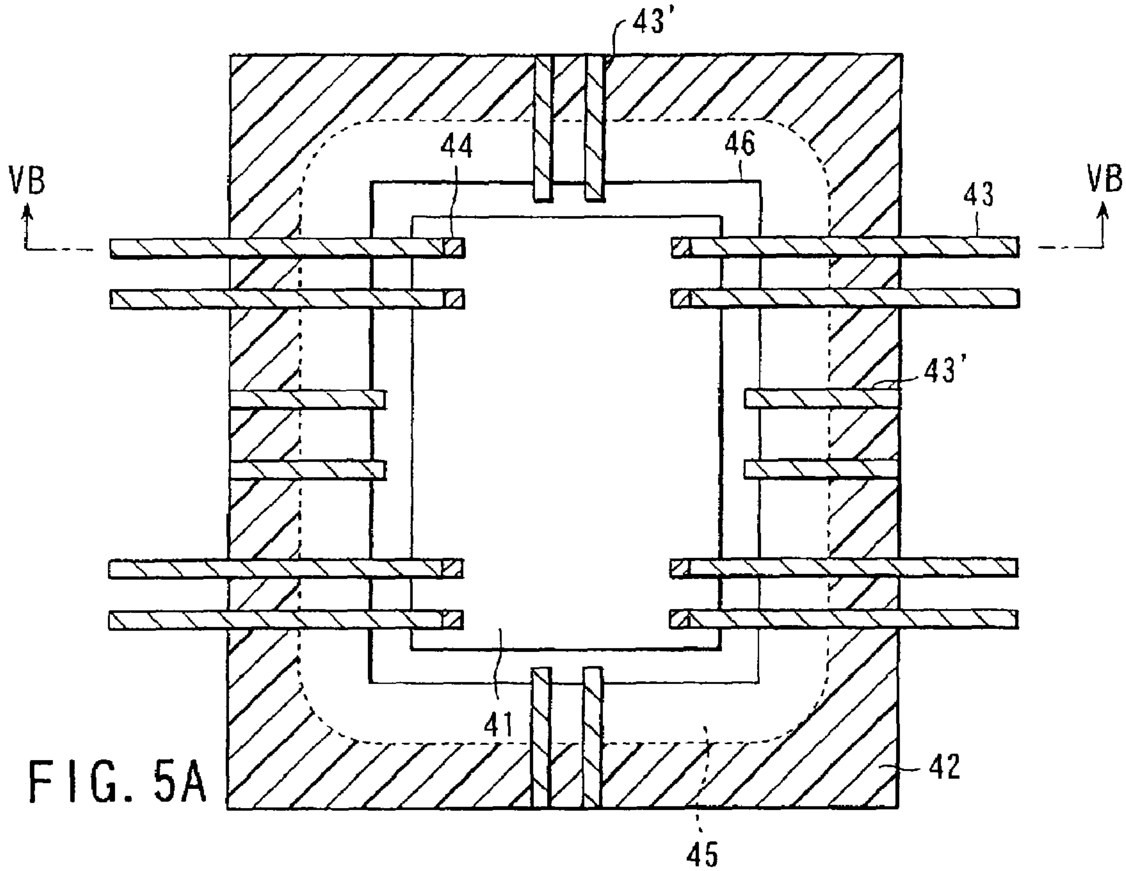
FIG. 5A is a plan view showing the construction of a semiconductor device according to a fourth embodiment of the present invention.
Figure 5B:
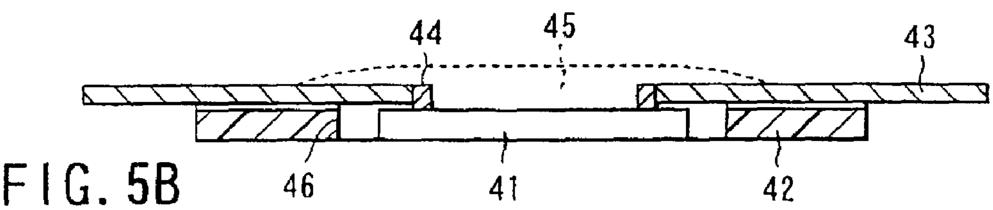
FIG. 5B is a cross sectional view along the line VB—VB shown in FIG. 5A.

A fourth embodiment of the present invention will now be described with reference to FIGS. 5A and 5B, wherein FIG. 5A is a plan view showing the construction of a semiconductor device according to the fourth embodiment of the present invention, and FIG. 5B is a cross sectional view along the line VB—VB shown in FIG. 5A. A silicon chip having a thickness of 50 μm is used as a semiconductor element (chip) 41.

On the other hand, a polyimide film 42 having a thickness of 75 μm is used as the interposer for supporting the chip 41 and holding a lead wire 43. The polyimide film 42 has an opening portion 46 called a device hole. One end portion of the lead wire 43, which is formed of, for example, a copper foil, extends into the opening portion 46 so as to be connected directly to a connection electrode (pad) 44 formed on the surface of the chip 41 by a single point ILB (Inner Lead Bonding) method, with the other end portion of the lead wire 43 extending outward from the polyimide film 42.

That portion of the lead wire 43 which extends outward from the polyimide film 42 constitutes an outer lead acting as an external connection terminal that is electrically connected to an external circuit. For connecting the lead wires to the semiconductor element, it is possible to employ a connection method in which bumps are formed on the pads and a TAB tape is used for connecting a large number of lead wires to the bumps at a time.

A plurality of pads 44 are formed on the chip 41. However, the pads 44 are not arranged dense, but are arranged sparse. In the fourth embodiment shown in FIGS. 5A and 5B, the lead wires 43 are arranged in, for example, the four corner portions of the chip 41. In other words, the lead wires and pads are not arranged in the central portion of each side of the chip. Since the lead wire 43 serving to improve the bonding strength between the chip 41 and a resin molding 45 is not arranged in the central portion in each side of the chip 41, cracks of the resin molding 45 tend to take place in the central portion in each side of the chip 41.

Therefore, in the fourth embodiment, a dummy lead wire 43' is formed in the peripheral portion of the opening portion 46 facing the central portion in each side of the chip 41. The dummy lead wire 43' does not extend outward from the polyimide film 42. Also, one end of the dummy lead wire 43' facing the chip 41 is positioned between the periphery of the opening portion 46 and the chip 41.

Since the dummy lead wire 43' is arranged in the portion where the lead wire 43 is not arranged, the chip 41 is bonded to the resin molding 45 with a high mechanical strength. To be more specific, it is possible for the dummy lead wire 43' mounted to the interposer together with the lead wire 43 to serve to improve the bonding strength between the resin molding 45 and the chip 41.

Figure 6:
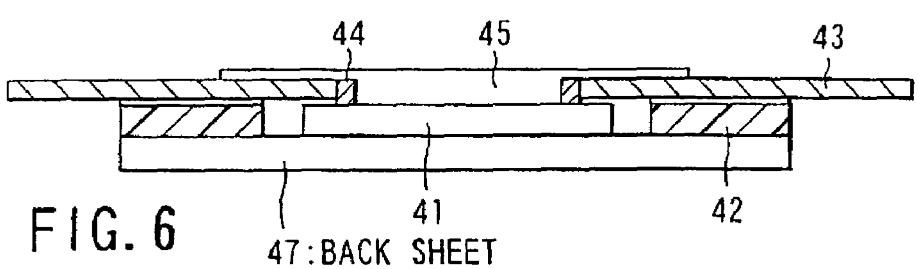
FIG. 6 is a cross sectional view showing the manufacturing process of the semiconductor device according to the fourth embodiment of the present invention.

The resin molding 45 is formed by a method differing from the method employed in each of the first to third embodiments described above. Specifically, in the fourth embodiment shown in FIGS. 5A and 5B, a back sheet 47 is mounted first to cover the back surfaces of the chip 41 and the polyimide film 42, as shown in FIG. 6. Then, a mask (not shown) is formed to cover the front surfaces of the chip 41 and the polyimide film 42, followed by a resin coating.

By this method, the resin molding 45 is formed on that surface of the chip 41 which includes the connecting portion between the lead wire 43 and the pad 44, the connecting portion being positioned within the opening portion 46 of the polyimide film 42, and the connection portion between the polyimide film 42 and the dummy lead wire 43' and is formed on the polyimide film 42. After formation of the resin molding 45, the back sheet 47 is removed. It should be noted that at least a single dummy lead wire is arranged in a large space having at least twice the minimum pitch of the lead wire arrangement.

In each of the embodiments described above, the technical idea of the present invention is applied to a semiconductor device including a single chip and a single interposer. However, the technical idea of the present invention can also be applied to a semiconductor device prepared by stacking a plurality of semiconductor devices of such a construction and mounting the stacked structure to an assembling substrate. As a method of integrating a plurality of semiconductor devices, employed is a method of mounting the outer lead wires, which are joined into a single body, to an assembling substrate, or a method of mounting an external terminal to an edge portion of a laminate structure of the interposers and connecting the external terminal to the assembling substrate.

As described above, the lead wires extending inward from the interposer are connected to the pad of a chip and the connecting portion is sealed with resin in the present invention. What should be noted is that, in the present invention, a dummy lead wire is interposed between adjacent lead wires and between the connecting portion and the resin molding so as to permit the chip to be bonded to the resin molding with a high mechanical strength.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor apparatus comprising:

a semiconductor device;

a plurality of lead wires connected to a plurality of connecting electrodes formed on said semiconductor device;

at least a first pair of dummy lead wires and at least a second pair of dummy lead wires, which are not electrically connected to said semiconductor device and do not include an outer lead portion for electrically connecting said semiconductor device to an external circuit of said semiconductor device, tip portions of said at least the first and second pairs of dummy lead wires extending over the semiconductor device;

an insulating film having an opening portion configured to accommodate said semiconductor device and to support said plurality of lead wires connected to the plurality of connecting electrodes of the semiconductor device and said at least the first and second pairs of dummy lead wires, said opening portion having four sides that define a perimeter of said opening portion, two of the four sides are opposite to each other in a first direction and form first opposite sides, and the other two of the four sides are opposite to each other in a second direction and form second opposite sides; and a resin molding configured to cover a connecting portion between tip portions of the plurality of lead wires and the plurality of connecting electrodes and the tip portions of said at least the first and second pairs of dummy lead wires within the opening portion of said insulating film, wherein one and the other of said at least the first pair of dummy lead wires are provided on one and the other of the first opposite sides of said insulating film, respectively, one and the other of said at least the second pair of dummy lead wires are provided on one and the other of the second opposite sides of said insulating film, respectively, each of the one and the other of said at least the first pair of dummy lead wires being arranged in corresponding first and second spaces defined by first and second two adjacent lead wires of said plurality of lead wires, respectively, so that a length of each of said first and second spaces is at least twice a minimum pitch between adjacent lead wires of said plurality of lead wires, said first two adjacent lead wires being provided on said one side of the first opposite sides of said insulating film to define said first space on said one side of said insulating film, and said second two adjacent lead wires being provided on said opposite side of the first opposite sides of said insulating film to define said second space on said opposite side of said insulating film.

2. A semiconductor apparatus according to claim 1, wherein a semiconductor chip in which the semiconductor device is formed has a thickness of approximately 50 μm.

3. A semiconductor apparatus according to claim 1, wherein the tip portions of the at least the first or second pair of dummy wires are connected to each other over the semiconductor device.

4. A semiconductor apparatus according to claim 1, wherein the plurality of lead wires are arranged on the one and the other of the first opposite side of the insulating film.

* * * * *